United States Patent [19]

Zelitzki et al.

[11] Patent Number: 4,614,917
[45] Date of Patent: Sep. 30, 1986

[54] MILLIMETER WAVE FREQUENCY SYNTHESIZER WITH AUTOMATIC LOOP GAIN CORRECTION AND SOPHISTICATED LOCK SEARCH SYSTEMS

[75] Inventors: Michael Zelitzki, Tel-Aviv, Israel; Yekutiel Josefsberg, Lafayette, Calif.

[73] Assignee: Tadiran Ltd., Givat Shmuel, Israel

[21] Appl. No.: 724,328

[22] Filed: Apr. 17, 1985

[30] Foreign Application Priority Data

May 1, 1984 [IL] Israel .................................. 71718

[51] Int. Cl.$^4$ ............................................. H03L 7/06
[52] U.S. Cl. ..................................... 331/1 A; 331/4; 331/17
[58] Field of Search ..................... 331/1 A, 4, 10, 12, 331/15, 16, 17, 23, DIG. 2

[56] References Cited

U.S. PATENT DOCUMENTS

| | | | |
|---|---|---|---|
| 4,077,016 | 2/1978 | Sanders et al. | 331/4 |
| 4,279,018 | 7/1981 | Carson | 331/DIG. 2 |
| 4,410,860 | 10/1983 | Kipp et al. | 331/1 A |

Primary Examiner—Eugene R. LaRoche
Assistant Examiner—D. C. Mis
Attorney, Agent, or Firm—Fleit, Jacobson, Cohn & Price

[57] ABSTRACT

There is provided an indirect frequency synthesizer in the millimeter wave frequency range of 36 to 38.6 GHz. The synthesizer comprises a high performance frequency translation loop for operation in the microwave frequency range and contains a voltage-controlled oscillator, an automatic loop gain correction system and a sophisticated lock search system. The frequency translation loop is operable under a variety of conditions (temperature etc.) and overcomes the considerable difficulties which exist in this frequency range such as maintenance of constant optimum loop parameters, thus making it possible to utilize the entire frequency tuning range of the millimeter wave oscillator. As a result, the synthesizer has very satisfactory characteristics as regards noise and spurious frequencies products.

20 Claims, 2 Drawing Figures

MILLIMETER WAVE FREQUENCY SYNTHESIZER WITH AUTOMATIC LOOP GAIN CORRECTION AND SOPHISTICATED LOCK SEARCH SYSTEMS

FIELD OF THE INVENTION

The use of a sophisticated frequency translation loop to realize a frequency synthesizer in the millimeter wave range of 36 to 38.6 GHz. The synthesizer consists of a phase lock loop containing conversion to IF, an automatic loop gain correction system and a sophisticated lock search system. The uniqueness of the loop derives from its ability to function under various conditions by overcoming the difficult problems that exist in this frequency range—primarily (a) the maintenance of constant optimum loop parameters, enabling to utilize the entire frequency tuning range of the millimeter wave oscillator and (b) low noise and spurious frequencies products.

BACKGROUND ART

The invention relates to a frequency synthesizer in the 36 to 38.6 GHz millimeter wave frequency range, and in particular to an automatic loop gain correction system and a sophisticated lock search system, both of which belong to the frequency translation loop.

Indirect synthesizers in this range suffer from the instability of the frequency translation loop parameters because of the gain ($\Delta F/\Delta V$) variations of the voltage controlled oscillators (VCO) at millimeter wave frequencies. This gain is not constant; it varies with temperature and time and it is not identical in different oscillators, resulting in gain variations of tens of dB. On the other hand, because of the narrow frequency tuning range and the high cost of millimeter wave oscillators, it is desirable to use one oscillator and to exploit its entire frequency tuning range, in which the gain variation is also several tens of dB. The oscillator gain variations cause variations in the loop gain, resulting in locking with undesirable loop parameters or failure to lock at all. In the past, various complicated methods were developed to overcome this problem, making wide use of low-frequency synthesizers together with multipliers and/or harmonic mixers, or the unavoidable use of several oscillators each operating in its linear frequency tuning range which is only part of the entire range, or the use of an open loop linearizer adapted specially to any VCO with the attending limited operation caused by the severe variations of the oscillator gain.

The subject of this invention is an indirect synthesizer, which, due to the automatic loop gain correction and sophisticated lock search systems, enables to overcome the above problems. The automatic loop gain correction system makes it possible to ignore variations of VCO's parameters or parameters of any other component in the loop (due to either differences between oscillators, temperature variations, frequency tuning or any other effect). As a result, the entire frequency tuning range of the oscillator can be utilized, while control of the loop gain makes possible a constant frequency translation loop bandwidth, and thus optimum noise and spurious frequencies products. The sophisticated lock search system allows coverage of the entire oscillator control voltage variation range without causing severe phase stress and without dependence on the dc gain between the phase detector output and the oscillator control voltage input. This gain varies, in order to compensate the change in the millimeter wave oscillator gain, because of the need to maintain constant loop gain. After the initial loop lock, the loop parameters are measured continuously; if changes occur in these parameters, the loop gain is corrected as is the locking voltage supplied by the search system, without loss of lock and without any disturbance in the loop.

Because the oscillator operates at a high frequency, it has a relatively very high sensitivity to frequency tuning due to changes in the control voltage. Thus, the control voltage must be highly free of noise, including noise generated by the analog components of the loop. Such performance is attained by correctly locating the blocks in the loop, selecting and designing correctly the closed loop components.

All the above circuits are implemented simply, using inexpensive components with low current drains, which are so simple that no microcomputer, software, etc., is required.

SUMMARY

The frequency synthesizer contains a phase lock loop that serves as a frequency translator containing an automatic loop gain correction system, a sophisticated lock search system and a low phase noise L-band reference synthesizer. The reference synthesizer output, in the range of 1500 to 1608 MHz, is multiplied and undergoes mixing, by a harmonic mixer, with the main loop oscillator output, which is in the range of 36 to 38.6 GHz, in order to generate a 100 MHz IF. This frequency is compared by the loop phase detector with an identical reference signal. The error voltage, after filtering, is supplied for the millimeter wave oscillator control.

The automatic loop gain correction system, which operates when the loop is locked, contains a generator for 90 KHz signal which is injected into the frequency translation loop circuits for sampling this signal at two points in the loop, and a decision and comparison system that varies the loop gain.

Thus, the synthesizer contains a sophisticated lock search system that operates both in the locked and unlocked loop states. This system contains a lock detector, a phase detector and a staircase generator which supplies a coarse tuning voltage to the oscillator. The main loop supplies the fine correction voltage.

DESCRIPTION OF THE PREFERRED EMBODIMENTS

General Structure

This section describes a millimeter wave frequency synthesizer containing an automatic loop gain correction system and a sophisticated lock search system, with which the synthesizer circuits can be implemented effectively and simply and the entire frequency tuning range of the millimeter wave VCO can be utilized. This is important, because the VCO is a problematic and expensive component, normally implemented with a Gunn diode or an Impatt diode.

The frequency synthesizer is based on a basic L-band reference synthesizer, which, after multiplication, serves as the local oscillator (LO) of a sophisticated millimeter wave frequency translation loop. The advantages of this method are efficiency, spectral purity and stability.

Structure of the Frequency Translation Loop

Figure 1:
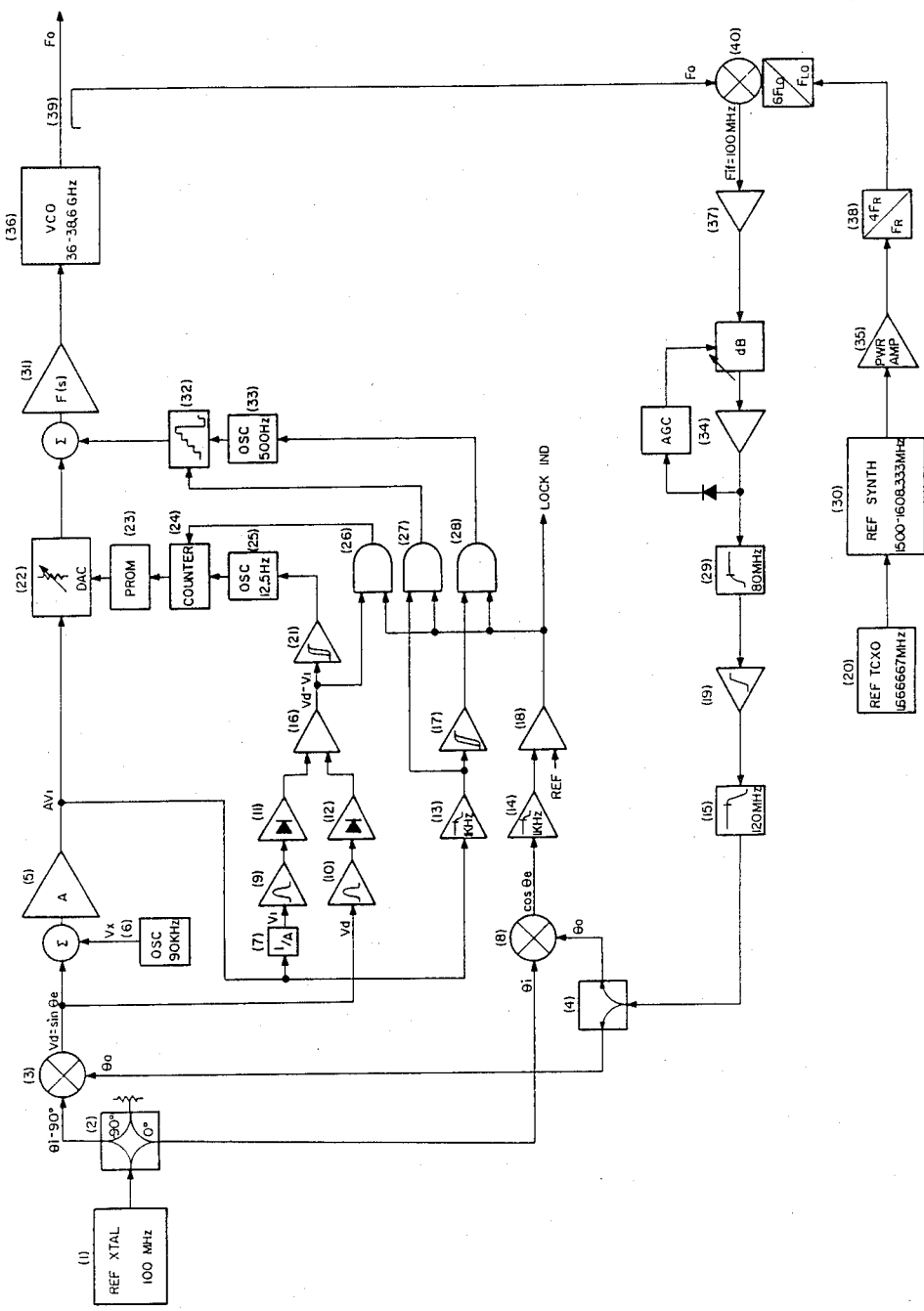
FIG. 1 is a block diagram of the frequency synthesizer.

The frequency translation loop is shown in FIG. 1. The basic reference synthesizer (30) operates in the frequency range of 1500 to 1608.333 MHz (in which frequency dividers are still available) and is stabilized by a 1.666667 MHz reference temperature-controlled crystal oscillator (TCXO) (20). This reference synthesizer generates 66 frequencies spaced 1.666667 MHz apart. The output power from the reference synthesizer is amplified by a power amplifier (35) and the frequency is multiplied by four in a passive multiplier (38). The output from the multiplier is supplied to a harmonic mixer (40), which, by means of the sixth harmonic of the LO and a sample of the millimeter wave oscillator (36) which is coupled via a directional coupler (39), generates a 100 MHz IF (according to the formula Fo−6-FLo=Fif). The IF signal is amplified (37) and passed through an AGC amplifier (34), high-pass filter (29), limiter (19) and low-pass filter (15) to the other frequency translation loop components and with a reference crystal oscillator (1) the loop is locked and generates a correction voltage for the millimeter wave oscillator. The function of the AGC amplifier (34) and the high-pass filter (29) is to prevent signals at frequencies lower than 100 MHz from reaching the limiter (19) at too high a level, where harmonics at 100 MHz can be generated and the loop might lock on them (for example, the second harmonic of a signal at 50 MHz, or the third harmonic of a signal at 33.333 MHz). Variations in the reference synthesizer frequency cause changes in the millimeter wave oscillator (36) frequency in the range of 36 to 38.6 GHz, for a total of 66 frequency channels spaced at intervals of $1.666667 \times 4 \times 6 = 40$ MHz. The reference synthesizer must be very stable and have very low phase noise, since its frequency and phase noise are multiplied by $4 \times 6 = 24$. For this reason, the reference signal source is a TCXO. On the contrary, the reference frequency (100 MHz) of the frequency translation loop is summed to the millimeter wave oscillator frequency, and its instability is negligible with respect to the millimeter wave frequency. As a result, an ordinary crystal source can be used for this purpose.

The IF signal at an angle of $\theta_o$ and the reference signal at an angle of $\theta_i$ pass through a 0° splitter (4) and a 90° splitter (2) and are supplied to the phase detector (3), which generates an output voltage proportional to $\sin \theta_e$ ($\theta_i - \theta_o = \theta_e$), and to the lock detector (8), which generates an output voltage proportional to $\cos \theta_e$. The two detectors are implemented with ordinary mixers. The correction voltage generated at the phase detector (3) passes through a summing amplifier (5) (with gain equal to A) to a digital-to-analog converter (DAC) (22), which acts as a controlled variable attenuator in the range of 1 to 1/100, whose function is to maintain constant loop gain. The DAC attenuation varies according to the gain variations of other components in the loop, principally the millimeter wave oscillator. From the DAC, the correction voltage is supplied to a summing amplifier+filter F(s) (31), which is the principal filter in the loop. At this point, the lock search voltage is added, and the sum voltage at the amplifier output is supplied as a control voltage to the millimeter wave oscillator (36) for frequency determination. Since in certain cases the oscillator gain ($\Delta F/\Delta V$) is very high, reaching up to 150 MHz/V, the active analog circuits in the loop path must be designed carefully, particularly with regard to internal noise output, in order to prevent a noisy control voltage, which would result in high phase noise at the frequency synthesizer signal output. Accordingly, it must be ensured that the correction voltage in the loop path does not decrease to a level approaching the internal noise level of the components. The correction voltage is therefore amplified by a factor of A in a summing amplifier (5) before being supplied to the DAC (22), which attenuates it back. In addition, the filter (31), which in an open loop is very narrowband, must be the last active element before the millimeter wave oscillator, thus, the internal noise of the components is greatly filtered. The components themselves must have relatively low internal noise.

Automatic Loop Gain Correction System

The automatic loop gain correction system corrects the DAC attenuation in accordance to the open-loop gain measurement. This measurement is performed continuously and only when the loop is locked. The attenuation correction is performed in discrete increments and only when the gain deviation exceeds a definite value. The measurement method is based on injection of a signal into the locked loop at a such a low level that it is not noticeable at the millimeter wave oscillator output as shown in FIG. 2.

Figure 2:
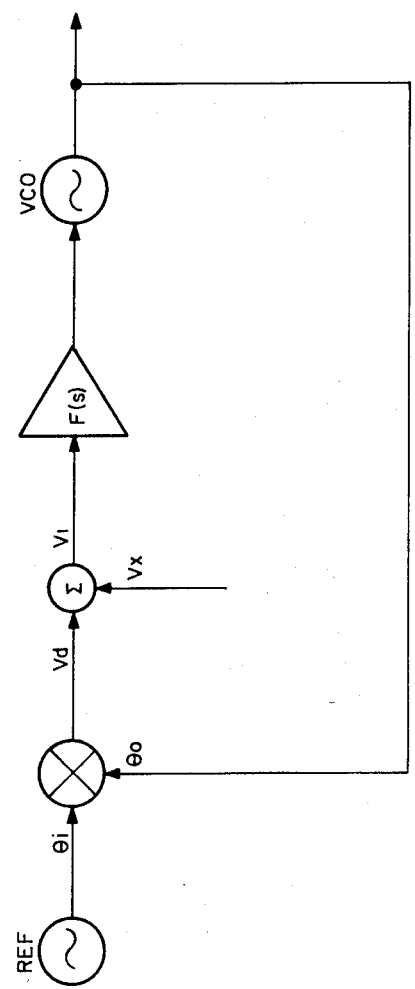
FIG. 2 is a block diagram explaining the operation principle of the automatic loop gain correction system.

For performing the theoretical computation, let us define:

H(s)=closed loop transfer function
$\zeta$=damping factor
$\omega_n$=natural frequency
$\omega_m$=injected signal frequency The signals are defined in FIG. 2.

$$H(s) = \frac{\theta_o}{\theta_i} = \frac{2\xi\omega_n s + \omega_n^2}{s^2 + 2\xi\omega_n s + \omega_n^2}$$

From the definition of the loop, we obtain:

$$\frac{Vd(s)}{Vx(s)} = -H(s)$$

$$V_1(s) = Vx(s) + Vd(s)$$

From which it follows that:

$$\frac{V_1(s)}{Vx(s)} = 1 + \frac{Vd(s)}{Vx(s)} = 1 - H(s)$$

By dividing the appropriate equations and substituting, we obtain:

$$\frac{Vd(s)}{V_1(s)} = \frac{-H(s)}{1 - H(s)} = -\frac{2\xi\omega_n s + \omega_n^2}{s^2}$$

After substituting $s = j\omega_m$, we obtain:

$$\frac{Vd(j\omega_m)}{V_1(j\omega_m)} = \frac{2j\zeta \frac{\omega_m}{\omega_n} + 1}{\left(\frac{\omega_m}{\omega_n}\right)^2}$$

After computing the absolute value, we obtain:

$$\left|\frac{V_d}{V_1}\right| = \frac{\sqrt{4\zeta^2\left(\frac{\omega_m}{\omega_n}\right)^2 + 1}}{\left(\frac{\omega_m}{\omega_n}\right)^2} \quad A$$

In order for the injected signal not to modulate the millimeter wave oscillator significantly, it is desirable that the Vd signal level be very low. If the ratio of the two signal levels (equation A) will be greater than unity, the signal $V_1$ will be that low that it might be "lost" in the noise. It is therefore required that:

$$|V_d/V_1| \leq 1$$

In our case, because of disturbance considerations, a modulation frequency as low as possible is required, thus determining:

$$|V_d/V_1| = 1$$

After substitution in equation A, we obtain:

$$(\omega_m/\omega_n)^4 - 4\zeta^2(\omega_m/\omega_n)^2 - 1 = 0$$

The general solution to this equation is:

$$\left(\frac{\omega_m}{\omega_n}\right)^2 = 2\zeta^2 \pm \sqrt{4\zeta^4 + 1}$$

And for $\zeta = 0.707$, we obtain:

$$\frac{\omega_m}{\omega_n} = 1.554 \quad B$$

In our case, because of phase noise and lock speed considerations, a relatively high value of $\omega_n$ is required, so that the frequency has been set as:

$$f_m = 90 \; KHz$$

As a result:

$$f_n = (90 \; KHz/1.554) \simeq 58 \; KHz$$

In FIG. 1, the 90 KHz oscillator (6) injects the test signal into the summing amplifier (5); voltage Vd appears at the input to the summing amplifier and voltage $V_1$ at the output of a 1/A attenuator (7) following the summing amplifier. At these points the voltages are very low, on the order of 10 mV, which is equivalent to a frequency modulation index of 0.05 in the millimeter wave oscillator. This value is sufficiently low so as not to cause disturbance in most cases of operation with angle modulation. In those cases where disturbance does still exist, the frequency of the injected signal ($f_m$) can be changed so that it is not in the transmitted information range, in order to eliminate the disturbance. Each of these signals passes through a very narrow band-pass filter (9), (10), which filters the signal out of the large amount of noise. These filters are implemented as active filters with very high Q. The filtered signals are supplied to sophisticated peak detectors (11), (12), which convert them to dc voltages proportional to the signal levels. The dc voltages are supplied to a differential amplifier (16), whose output voltage is proportional to $Vd - V_1$. That is, in the desired condition, when $Vd = V_1$, the voltage becomes zero. From equation A and the parameter definitions, it can be seen that when $Vd > V_1$ (that is, the output voltage from the differential amplifier is positive), $\zeta$, $\omega_n$ and so the open-loop gain are too high, and it follows that the DAC attenuation must be increased. When $Vd < V_1$ (that is, the output voltage from the differential amplifier is negative), $\zeta$, $\omega_n$ and so the open-loop gain are too low, and the DAC attenuation must be reduced. The voltage at the differential amplifier output (16) is supplied to a window voltage comparator (21) which, when $|Vd - V_1|$ exceeds a definite value, activates a 12.5 Hz square wave generator (25). The square wave generator operates a counter (24), whose function is to vary the DAC attenuation incrementally. The output of the differential amplifier (16) is also connected via an AND gate (26) to an input of the counter, which, in accordance with a logic level (that is, in accordance with the sign of $Vd - V_1$) controls the direction of counting (count-up or count-down), that means reducing or increasing the DAC attenuation. The automatic loop gain correction system can operate only when the loop is locked. In the case of no lock, it is indeed true that $(Vd - V_1) \neq 0$, a state that operates the counter, but the sign can change randomly, and with it the direction of counting. For this reason, the Lock Ind indication is also supplied to the AND gate (26) and causes the counter to count in a defined direction in the event of no lock. The output from the counter (24) consist of five bits—that is, a count of 32 different works. To cover the entire required variation range, the DAC input comprises 10 bits—that is, 1024 different words, causing linear variation of the attenuation. The PROM (23) operates as an interface and converts the 32 counter words to DAC words, which cause variation of the attenuation over the entire range, but in 32 logarithmic increments. The voltage window in the window voltage comparator (21) is designed so that three increments will nominally be included in it, to leave room for unplanned parameter changes. The level of voltages Vd and $V_1$ need not be accurate, since the system causes the difference between them to approach zero, and as a result, a change in the voltage level will not affect the ability of performing automatic gain correction, but affect only the number of increments that are included in the window of the window voltage comparator.

In summary, the automatic loop gain correction system operates when the loop is locked, continuously measures the open loop gain and corrects the gain in the proper direction when necessary. The correction is made after initial locking or during operation if loop parameters have changed; it occurs in a manner that does not affect the millimeter wave output signal of the frequency synthesizer. The gain is corrected incrementally and not continuously, thus avoiding a complicated situation involving an additional closed loop in the phaselock loop. The gain correction range is in a ratio of 100:1 (40 dB), which is a very wide range that enables to operate various varactor-controlled oscillators at a frequency control voltage actually starting at OV and extending up to the breakdown voltage.

Lock Search System

The sophisticated lock search system accomplishes the search by means of a staircase generator, which causes a small discrete increments change in the millimeter wave oscillator control voltage. Contrary to other methods in which the search voltage is no longer supplied after lock is detected and the loop must compensate for this voltage by phase stress and/or high dc gain between the phase detector output and the oscillator control voltage input, in the system described here the search voltage mainains its last value from before the search was stopped, even after the system has detected lock and the search has been stopped. Since there is no need for severe phase stress, the lock detection circuits cause the search to stop only for a small value of the angle $\theta_e$. In addition, this angle is also corrected in a locked loop, with no detectable disturbance, when loop parameters have changed during operation.

The lock detection circuits are based on the lock detector (8), which generates an output voltage proportional to $\cos \theta_e$, and the phase detector (3), which generates an output voltage proportional to $\sin \theta_e$. In the case of lock without phase stress ($\theta_e = 0$), the output voltage from the lock detector is $\cos 0° = 1$ (in the case of lock on an image frequency, the voltage will be $\cos 180° = -1$), and the output voltage from the phase detector is $\sin 0° = 0$. In the case of unlock, the output voltage from both detectors is zero. Thus, for initial detection of lock it is necessary to detect a voltage at the lock detector output ($\cos \theta_e$), where the level of the voltage corresponds to the phase stress defined as a threshold. This phase stress must usually be relatively large because of the inability of a phase detector to be precise in generating a voltage in excess of a definite threshold level. After the initial lock, the phase detector ($\sin \theta_e$) starts operating normally, and the search continues, with the objective of reaching a zero level at the output of this phase detector. The phase detector output voltage will be positive for positive phase stress and negative for negative phase stress. It follows that by identifying the polarity of the voltage it is possible to decide upon the direction of search—that is, whether to increase or decrease the voltage.

In FIG. 1, the output voltage from the lock detector ($\cos \theta_e$)/(8) passes through a 1 KHz low-pass filter (14) (whose function is to attenuate the noises accompanying the voltage, particularly the signal at 90 KHz) to a threshold comparator (18), which decides on the existence of lock for phase stress of no more than ±40°. A logic signal at the threshold comparator output is supplied to AND gates (26), (27), (28). The output voltage from the phase detector ($\sin \theta_e$), after amplification by a summing amplifier (5), also passes through a low-pass filter (13) (which performs the same function as (14)) and is supplied to a window voltage comparator (17), which causes stop of search for phase stress of no more than ±20°. A logic signal at the window voltage comparator output is supplied to an AND gate (28), which activates a 500 Hz square-wave generator (33) when necessary. This signal source operates a staircase generator (32), which generates the search signal that passes through a summing amplifier + filter (31) to the closed loop path and is added to the voltage in the closed loop. AND gate (28) stops the lock search only if it receives such an instruction from both the lock detector ($\cos \theta_e$) and the phase detector ($\sin \theta_e$); that is, when lock has been detected by the lock detector ($\cos \theta_e$), and the phase stress does not exceed the permissible value. The output of the low-pass filter (13) is also connected via another AND gate (27) to an input of the staircase generator which, according to a logic level (that is, according to the polarity of phase stress), controls the search direction, which means increase or decrease of the voltage. The phase detector ($\sin \theta_e$) can operate only when the loop is locked. In the case of unlock, the voltage obtained at its output is zero and the direction of search is undefined. For this reason, the Lock Ind indication is also supplied to AND gate (27) and causes a defined direction of search in the case of unlock. The staircase generator is implemented by a counter and a resistor network connected to eight of the outputs of the counter, which enable 256 voltage steps that cover the entire voltage range required for the search; in this case 0 to 30 V. The phase stress, which is identical for each step, depends on the dc gain between the phase detector output and the oscillator control voltage input. This gain varies because of changes in the DAC states, and as a result of the gain variation the phase stress is different for each step. The greatest stress occurs for the lowest gain—that is, in the state of maximum DAC attenuation. For this state, the gain has been designed so that nominally four steps will be included in the search stop range of the phase detector (±20°), in order to leave room for unplanned parameter changes. The accuracy of the decisions made by the phase detector window voltage comparator is not significant, since the system wishes the phase stress to approach zero. It follows that inaccuracy will not affect the lock capability, but rather only the number of steps that are included in the ±20° range.

In summary, the sophisticated lock search system first operates when the loop is unlocked on the lock detector control; after lock, the search system continues to correct the phase stress in the right direction according to the phase detector control, down to minimum phase stress. This correction is accomplished after initial lock or during operation if loop parameters have changed; the correction does not affect the millimeter wave output signal of the frequency synthesizer. The sophisticated lock search system makes lock possible in the entire oscillator control voltage range with small maximum phase stress corresponding to one search voltage step, which is approximately 100 mV, independently of the dc gain (which also is low) between the phase detector output and the oscillator control voltage input. This performance makes possible more flexibility in implementing this part of the loop; such flexibility is required in the present case for adding another component—the DAC.

General

The speed of lock search and phase zeroing is limited in unlock state by the bandwidth of the summing amplifier + filter (31), and in lock state by the bandwidth of the locked loop. The relation of this speed to the loop gain correction speed is determined by a computation that shows that lock is possible in a range of every 10 continuous gain-correction steps. This initial lock does not occur with the optimum parameters, but at this stage the lock detection and gain correction circuits can function and bring the loop to the optimum state. If one lock search cycle is performed for every 10 gain correction steps, then in one gain correction cycle $31/10 = 3.2$ lock search cycles will occur, and the number of five cycles has been selected with a safety factor. If the lock search rate is 500 Hz for each step, the gain correction rate will be $(32/5/256/500) = 12.5$ Hz.

The automatic loop gain correction and the sophisticated lock search systems, as described above, enable to implement the millimeter wave frequency synthesizer by using one millimeter wave oscillator over its entire frequency tuning range and over a wide temperature range (which causes a severe parameters variation). Replacing the millimeter wave oscillator with one having different parameters does not bring about changes in the frequency translation loop. These circuits enable to overcome automatically all the problems involved in such a synthesizer and particularly makes possible compensation for parameter changes, during continuous operation without disturbance. It is actually possible to vary the frequency of the frequency synthesizer over the entire tuning range without loss of lock. The frequency translation loop is matched in this case to a particular synthesizer, but it can be adapted easily to any other synthesizer that has similar problems. The frequency translation loop circuits are implemented simply and economically, with no need for a microcomputer to control the operations. All the components other than the operational amplifiers are implemented with CMOS technology, with very low power consumption but sufficiently fast for the requirements of the circuits.

We claim:

1. An indirect frequency synthesizer comprising a high performance frequency translation loop for operation in the microwave frequency range including a microwave voltage-controlled oscillator (VCO) operating at the output frequency, an automatic loop gain correction system and a lock search system, said frequency translation loop adapted to operate during variations of VCO parameters caused by interchanging of VCOs, frequency tuning and temperature and time variations, and said frequency translation loop utilizing the entire frequency tuning range of the microwave oscillator and with optimum output signal performance of low noise and spurious frequencies products.

2. A frequency synthesizer according to claim 1, operating in the millimeter wave frequency range.

3. A frequency synthesizer according to claim 1, comprising said automatic loop gain correction system, having a wide gain correction range, for utilizing the entire frequency tuning range of said microwave voltage-controlled oscillator and/or for operation with interchanged VCOs having different parameters, while retaining constant optimum loop parameters.

4. A frequency synthesizer according to claim 3, including signal injection means for injecting a signal to a locked loop, said signal being at a low level substantially unnoticeable in said output signal and/or at a frequency not in a transmitted information range, and means for measuring the open-loop gain continuously without noticeable disturbance in the output signal when the loop is locked.

5. A frequency synthesizer according to claim 4, wherein continuous measurement of said open-loop gain when the loop is locked, is used for correction of the loop gain accordingly and automatically.

6. A frequency synthesizer according to claim 3, including means for decision on gain correction based on an absolute value of a voltage difference $|V_d - V_1|$ between input and output of a summing amplifier in the frequency translation loop approaching zero, for injecting a test signal at a level that is not particularly precise.

7. A frequency synthesizer according to claim 6, including measurement means of the polarity of said voltage difference $V_d - V_1$, for providing information regarding direction of the gain correction; either increasing or decreasing the gain.

8. A frequency synthesizer according to claim 7, wherein information provided by a differential amplifier in the automatic loop gain correction system regarding direction of the gain correction, and appropriate controlled correction speed are used by said automatic loop gain correction system for correction of the loop gain during operation of the frequency synthesizer without noticeable disturbance in the output signal.

9. A frequency synthesizer according to claim 1, comprising said lock search system, for covering by a search voltage the entire control voltage variation range of said microwave voltage-controlled oscillator, without causing severe phase stress and independently of the dc gain between an output of a phase detector and an input for the microwave oscillator control voltage both of which are in the frequency translation loop thereby making variable dc gain possible.

10. A frequency synthesizer according to claim 9, wherein a staircase generator means is used to generate said search voltage, for maintaining this search voltage at its final value before the search stops, even after the lock detection and the search process stops.

11. A frequency synthesizer according to claim 10, wherein the search voltage that is maintained even after the search stops, is used for lock with minimum phase stress and low said dc gain between the phase detector output and the oscillator control voltage input.

12. A frequency synthesizer according to claim 11, wherein lock at low said dc gain between the phase detector output and said oscillator control voltage input, is used in the operation of the frequency translation loop independently of this gain.

13. A frequency synthesizer according to claim 9, including lock detector means and phase detector means, for detecting initial lock by means of said lock detector and for continuation of the search according to said phase detector down to minimum phase stress.

14. A frequency synthesizer according to claim 9, including use of said phase detector means based on its output voltage approaching zero, for correction of the phase stress to a minimum, without special accuracy requirements for the system components involved, as opposed to when only a lock detector is used.

15. A frequency synthesizer according to claim 14, including measurement means of the polarity of said phase detector output voltage, for providing information regarding direction of the search; either increasing or decreasing the voltage.

16. A frequency synthesizer according to claim 15, wherein information provided by the phase detector in the frequency translation loop regarding direction of the search, and appropriate controlled search speed, are used by said lock search system correcting the phase stress during operation of the frequency synthesizer without noticeable disturbance in the output signal.

17. A frequency synthesizer according to claim 1, wherein the circuits of said frequency translation loop means are designed correctly, for a noise-free control voltage, which in a microwave frequency synthesizer, in which the oscillator gain $\Delta F/\Delta V$ is very high, results in a low-phase-noise output signal.

18. A frequency synthesizer according to claim 1, comprising frequency translation loop means operating at a low frequency relatively to a synthesizer output frequency, for using a reference source that is not particularly stable.

19. A frequency synthesizer according to claim 1, comprising said frequency translation loop including a high-pass filter in an IF path following a harmonic mixer, for preventing lock on harmonics at frequency of 100 MHz of signals at frequencies lower than 100 MHz.

20. A frequency synthesizer according to claim 1, comprising universally implemented frequency translation loop means operating at a low frequency, for easy matching thereof to any other frequency synthesizer.

* * * * *